United States Patent
Murayama et al.

(10) Patent No.: US 11,929,591 B2
(45) Date of Patent: Mar. 12, 2024

(54) SEMICONDUCTOR LIGHT-EMITTING DEVICE AND METHOD OF MANUFACTURING SEMICONDUCTOR LIGHT-EMITTING DEVICE

(71) Applicant: SONY CORPORATION, Tokyo (JP)

(72) Inventors: Masahiro Murayama, Kanagawa (JP); Takashi Sugiyama, Miyagi (JP)

(73) Assignee: SONY CORPORATION, Tokyo (JP)

( * ) Notice: Subject to any disclaimer, the term of this patent is extended or adjusted under 35 U.S.C. 154(b) by 786 days.

(21) Appl. No.: 16/979,606

(22) PCT Filed: Feb. 15, 2019

(86) PCT No.: PCT/JP2019/005605
§ 371 (c)(1),
(2) Date: Sep. 10, 2020

(87) PCT Pub. No.: WO2019/181309
PCT Pub. Date: Sep. 26, 2019

(65) Prior Publication Data
US 2021/0044088 A1 Feb. 11, 2021

(30) Foreign Application Priority Data
Mar. 19, 2018 (JP) .................... 2018-050642

(51) Int. Cl.
*H01S 5/22* (2006.01)
*H01S 5/0234* (2021.01)
(Continued)

(52) U.S. Cl.
CPC .............. *H01S 5/22* (2013.01); *H01S 5/0234* (2021.01); *H01S 5/0237* (2021.01); *H01S 5/34333* (2013.01)

(58) Field of Classification Search
CPC ........ H01S 5/22; H01S 5/0234; H01S 5/0237; H01S 5/34333; H01S 5/0201;
(Continued)

(56) References Cited

U.S. PATENT DOCUMENTS 7,592,637 B2 * 9/2009 Zimmerman ........... H01L 33/20
257/98
7,701,991 B2 * 4/2010 Bean ...................... H01S 5/2231
257/14

(Continued)

FOREIGN PATENT DOCUMENTS

JP 51-099986 A 9/1976
JP 10-041583 A 2/1998
(Continued)

OTHER PUBLICATIONS

International Search Report and Written Opinion of PCT Application No. PCT/JP2019/005605, dated Apr. 23, 2019, 10 pages of ISRWO.

*Primary Examiner* — Vu A Vu
(74) *Attorney, Agent, or Firm* — CHIP LAW GROUP

(57) ABSTRACT

A semiconductor light-emitting device includes a stacked body, a cutout section, and a high-resistance region. The stacked body includes a first conductive-type semiconductor layer, an active layer, and a second conductive-type semiconductor layer in this order and has paired side faces opposed to each other. The cutout section is provided on at least one of the paired side faces of the stacked body and has a bottom face where the first conductive-type semiconductor layer is exposed. The high-resistance region is provided from the vicinity of the bottom face of the cutout section to the side face of the stacked body and has electric resistance higher than the electric resistance of the stacked body in a periphery of the high-resistance region.

16 Claims, 8 Drawing Sheets

(51) Int. Cl.
*H01S 5/0237* (2021.01)
*H01S 5/343* (2006.01)

(58) Field of Classification Search
CPC .............. H01S 5/2063; H01S 5/2086; H01S 2301/176; H01S 5/2224; H01S 5/2201; H01L 33/005; H01L 2933/0033; H01L 2933/0066; H01L 33/025; H01L 33/14; H01L 33/62
USPC ...................................... 372/44.01
See application file for complete search history.

(56) References Cited

U.S. PATENT DOCUMENTS

| 7,939,351 | B2* | 5/2011 | Osawa | H01L 33/0093 257/98 |
|---|---|---|---|---|
| 7,943,942 | B2* | 5/2011 | Jiang | H01L 33/44 257/97 |
| 7,995,634 | B2* | 8/2011 | Kitano | H01S 5/227 372/46.015 |
| 8,338,202 | B2* | 12/2012 | Chinone | H01L 21/2007 438/33 |
| 8,368,107 | B2* | 2/2013 | Bae | H01L 33/44 257/98 |
| 8,563,334 | B2* | 10/2013 | Huang | H01L 33/0093 438/22 |
| 9,040,322 | B2* | 5/2015 | Sato | H01L 33/0095 438/42 |
| 9,583,466 | B2* | 2/2017 | McGroddy | H01L 24/75 |
| 10,032,757 | B2* | 7/2018 | Zhang | H01L 33/62 |
| 10,768,515 | B2* | 9/2020 | Choy | G03B 21/28 |
| 2006/0001035 | A1* | 1/2006 | Suehiro | H01L 33/38 438/22 |
| 2007/0002914 | A1 | 1/2007 | Ryu et al. | |
| 2007/0217458 | A1 | 9/2007 | Kitano et al. | |

FOREIGN PATENT DOCUMENTS

| JP | H10294493 A | 11/1998 |
|---|---|---|
| JP | 2005-311309 A | 11/2005 |
| JP | 2006-073618 A | 3/2006 |
| JP | 2009231820 A | 10/2009 |
| JP | 2012-169435 A | 9/2012 |
| KR | 10-2007-0000290 A | 1/2007 |
| WO | 2005/093919 A1 | 10/2005 |

* cited by examiner

[FIG. 1]
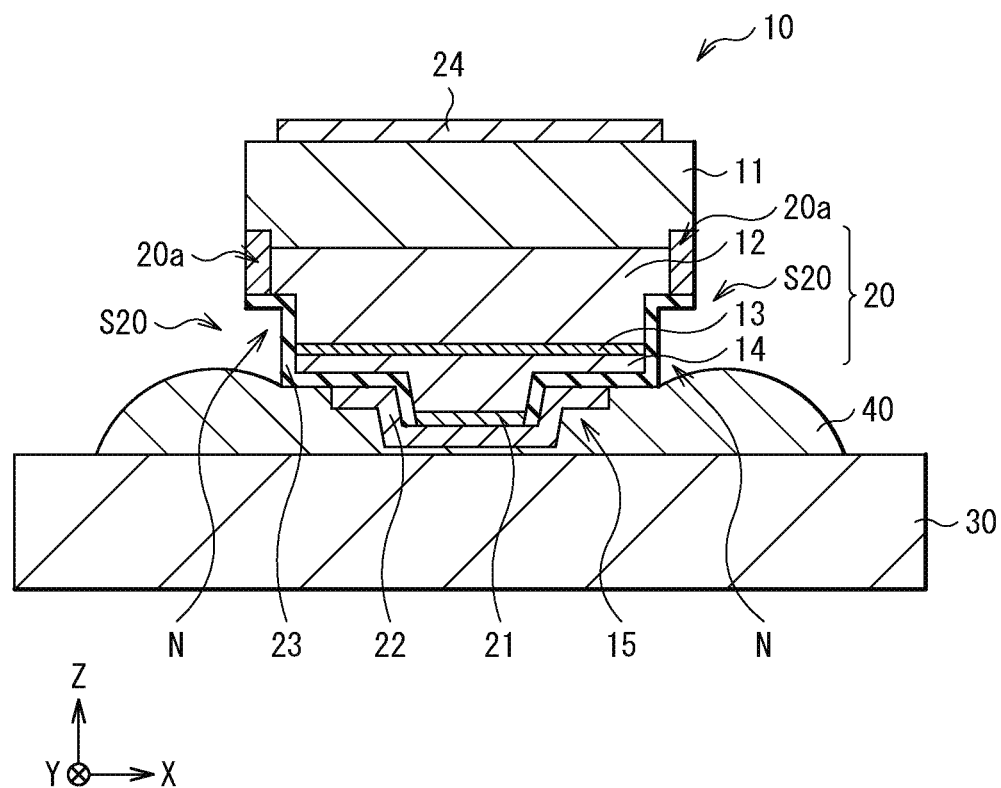
[FIG. 2]
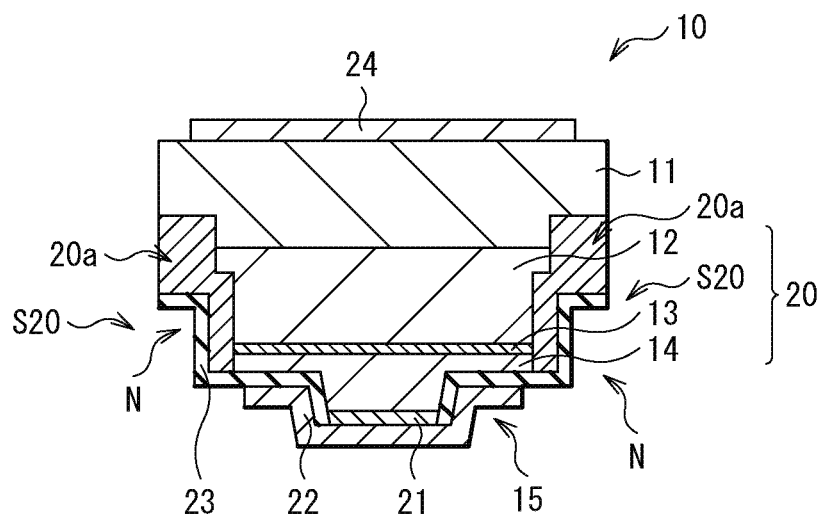

[ FIG. 3A ]
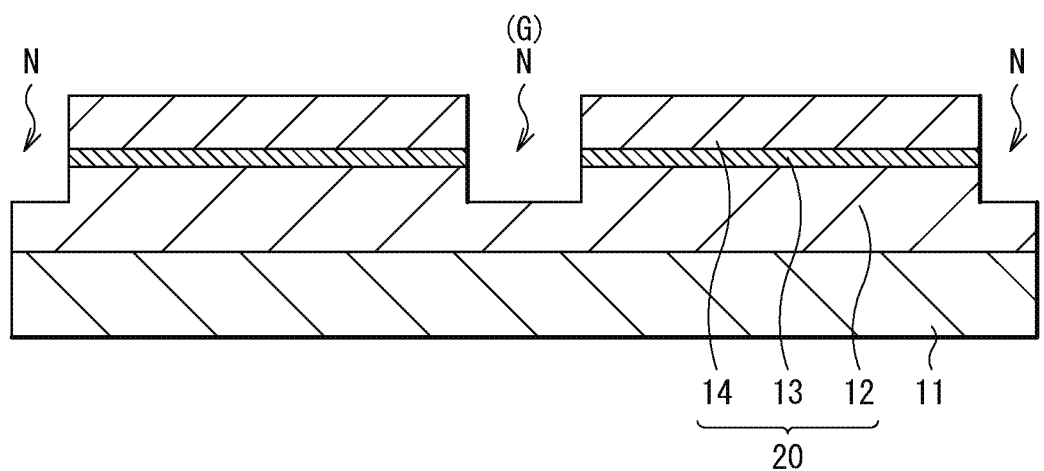
[ FIG. 3B ]
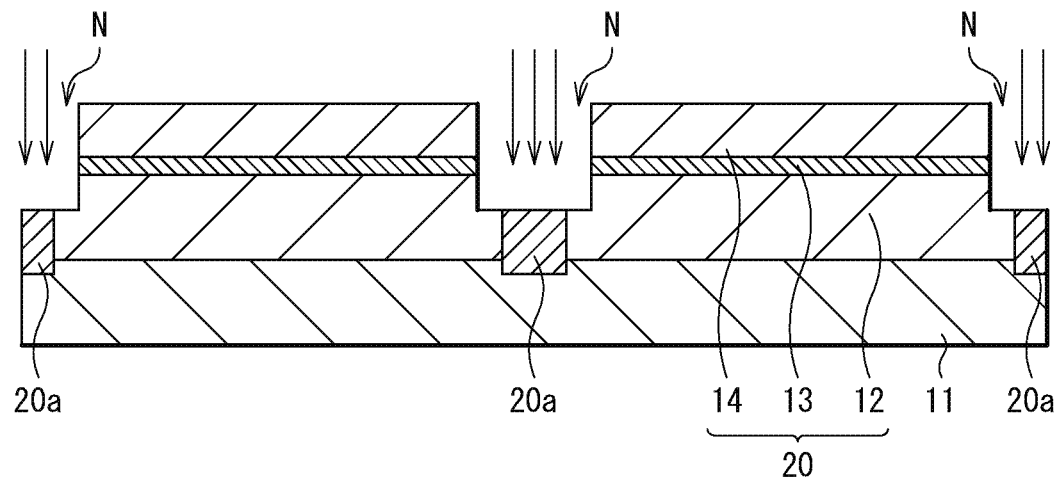

[ FIG. 3C ]
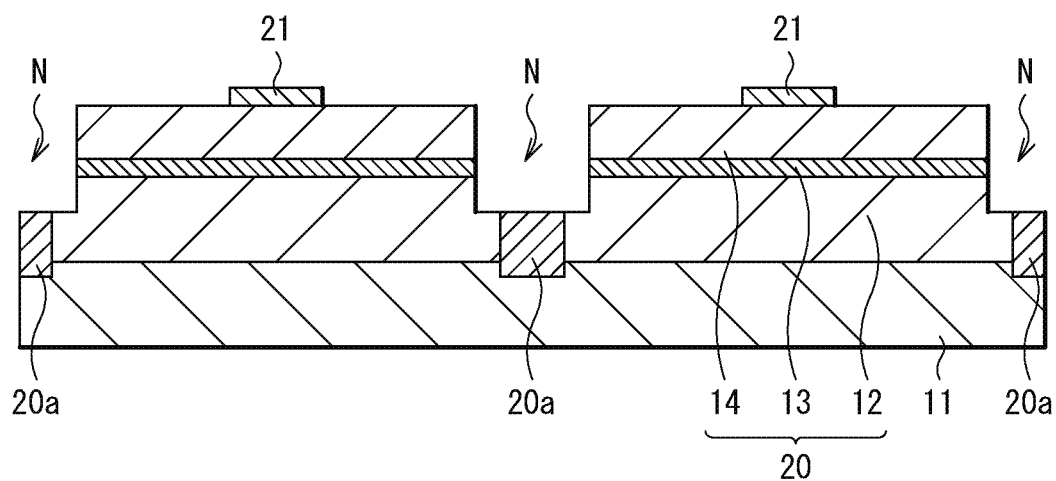
[ FIG. 3D ]
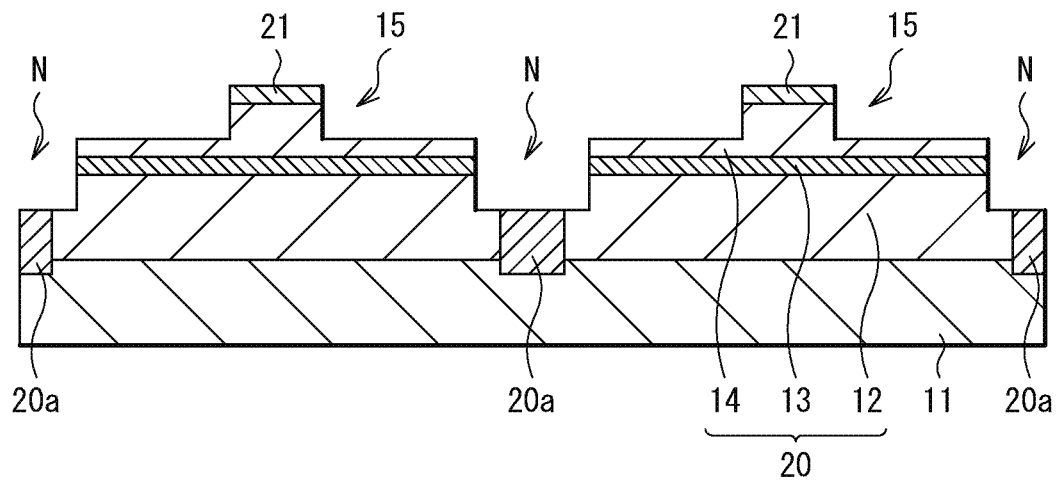

[ FIG. 3E ]
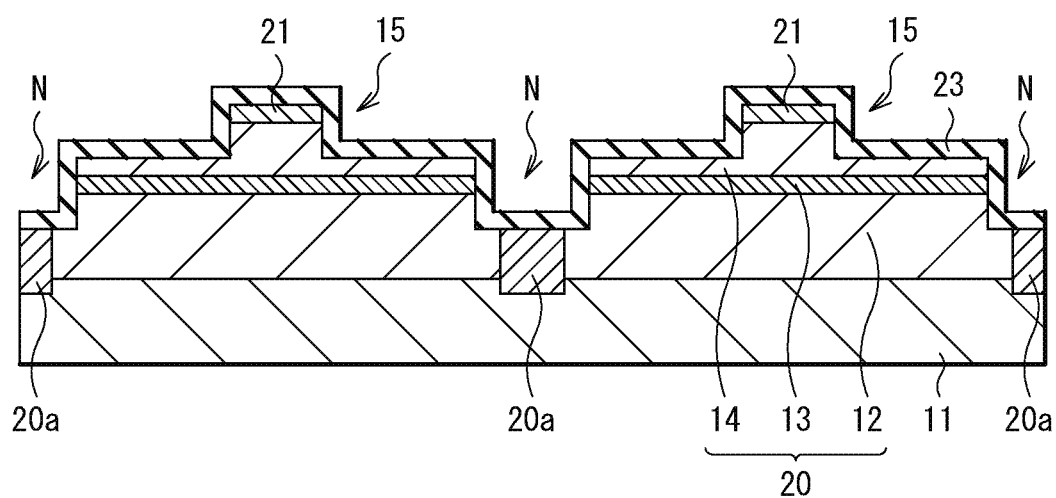
[ FIG. 3F ]
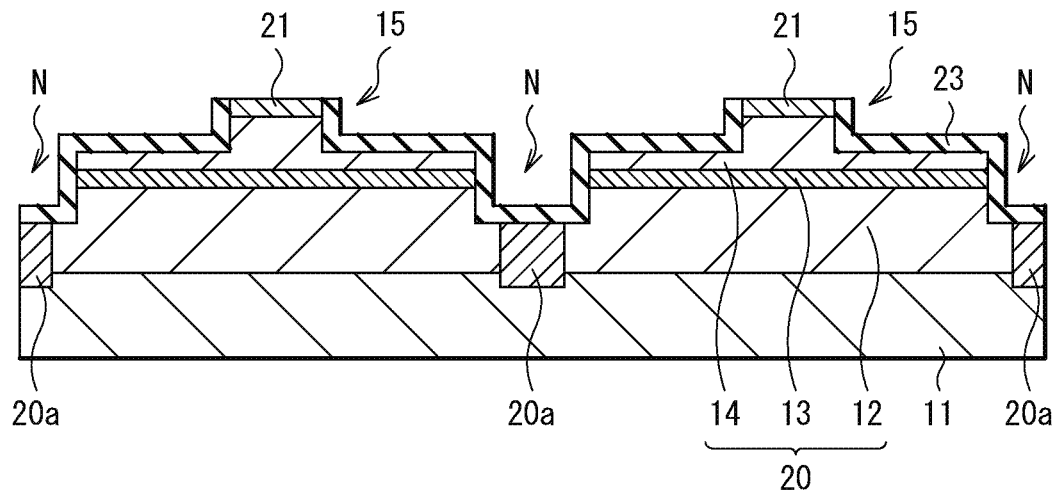

[ FIG. 3G ]
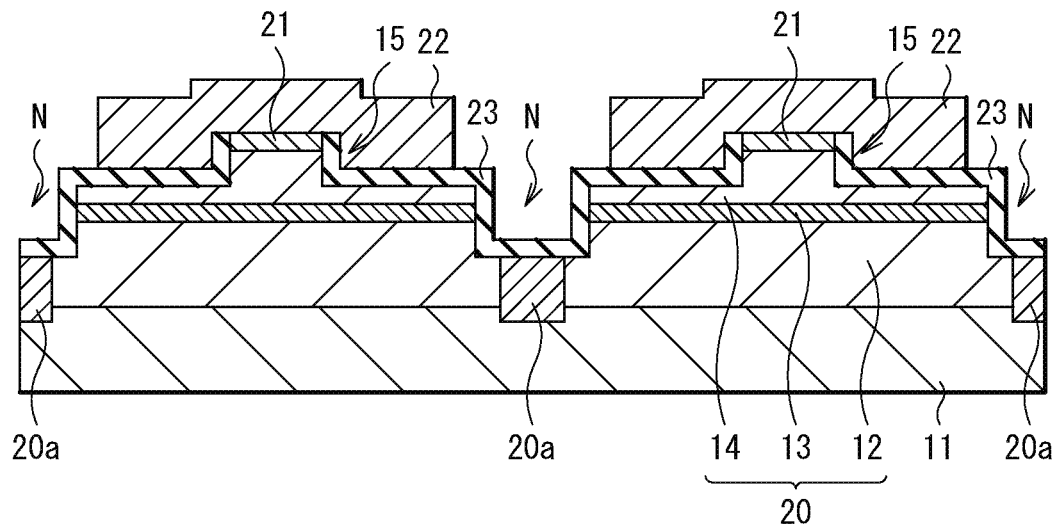
[ FIG. 3H ]
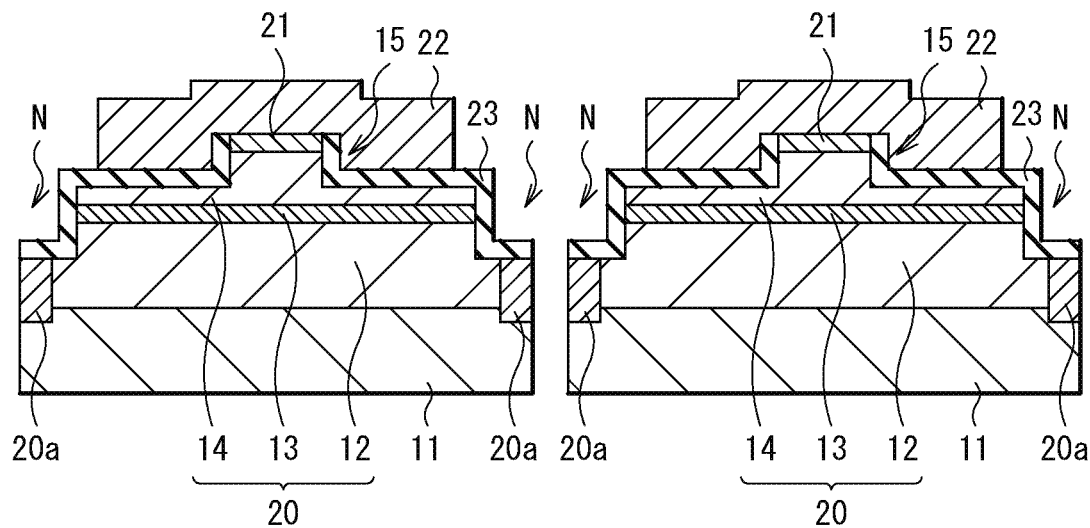

[ FIG. 4A ]
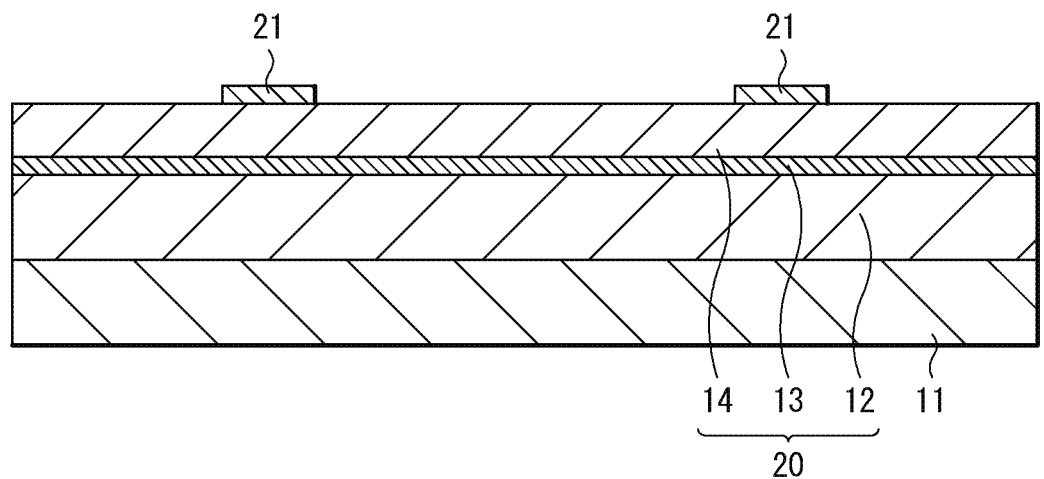
[ FIG. 4B ]
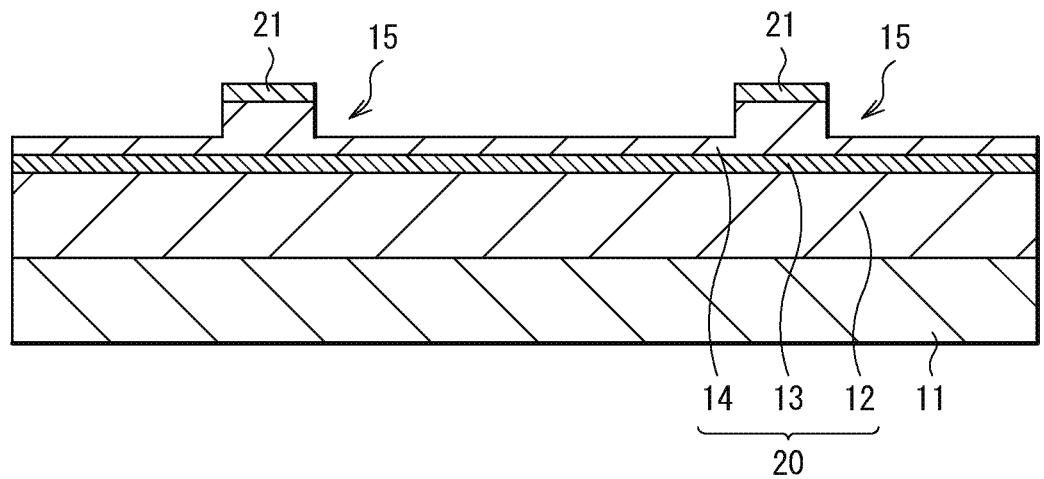

[ FIG. 5A ]
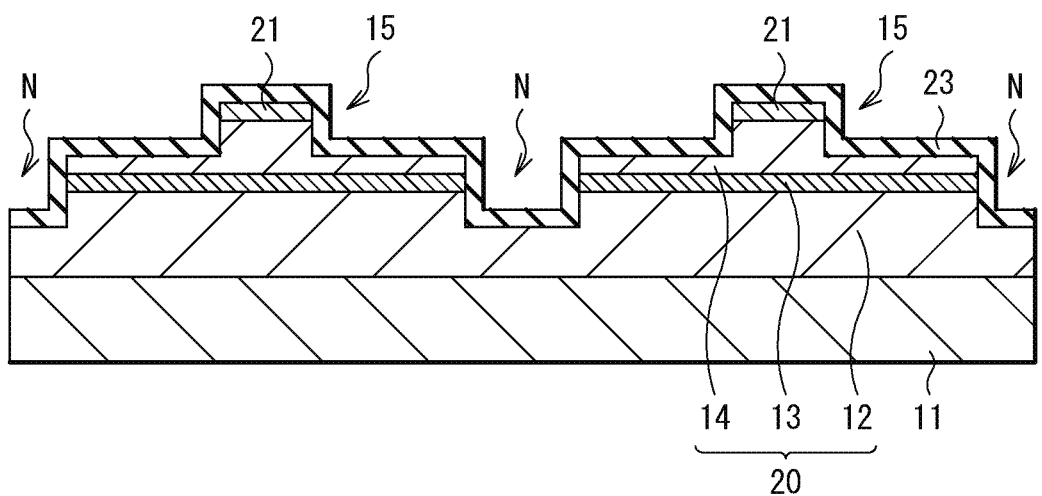
[ FIG. 5B ]
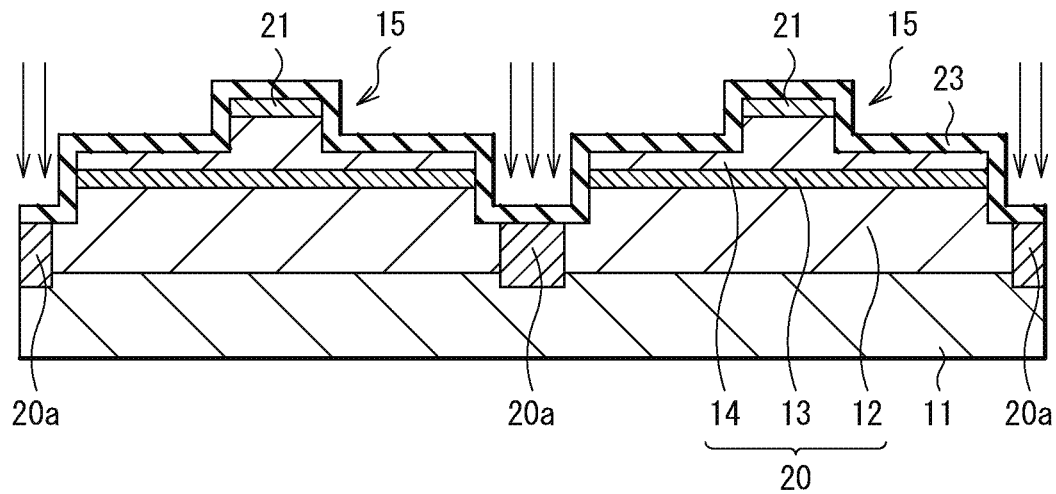

[ FIG. 6 ]
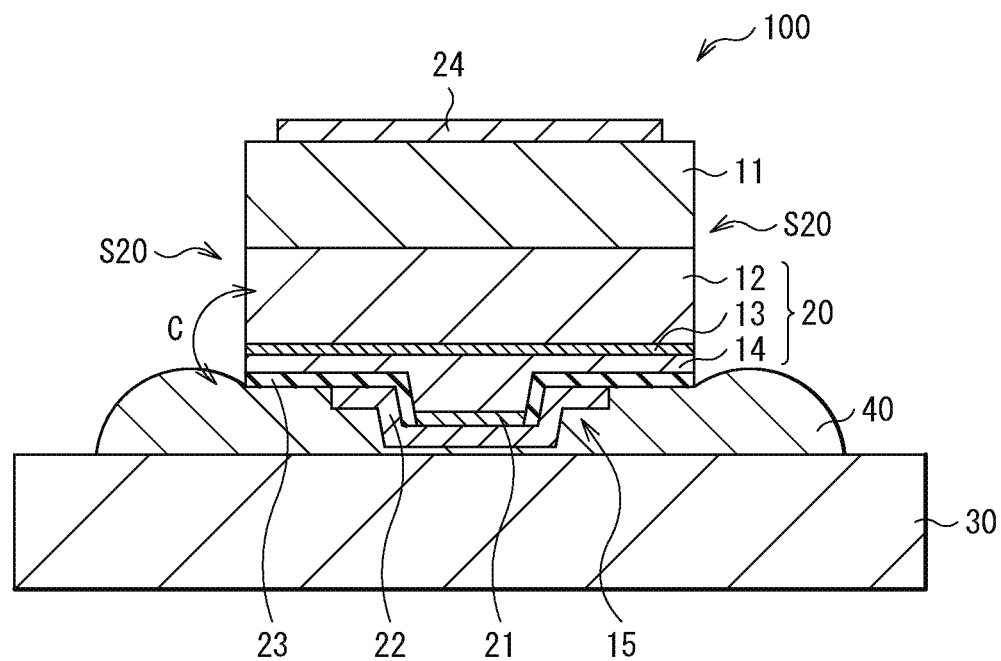
[ FIG. 7 ]
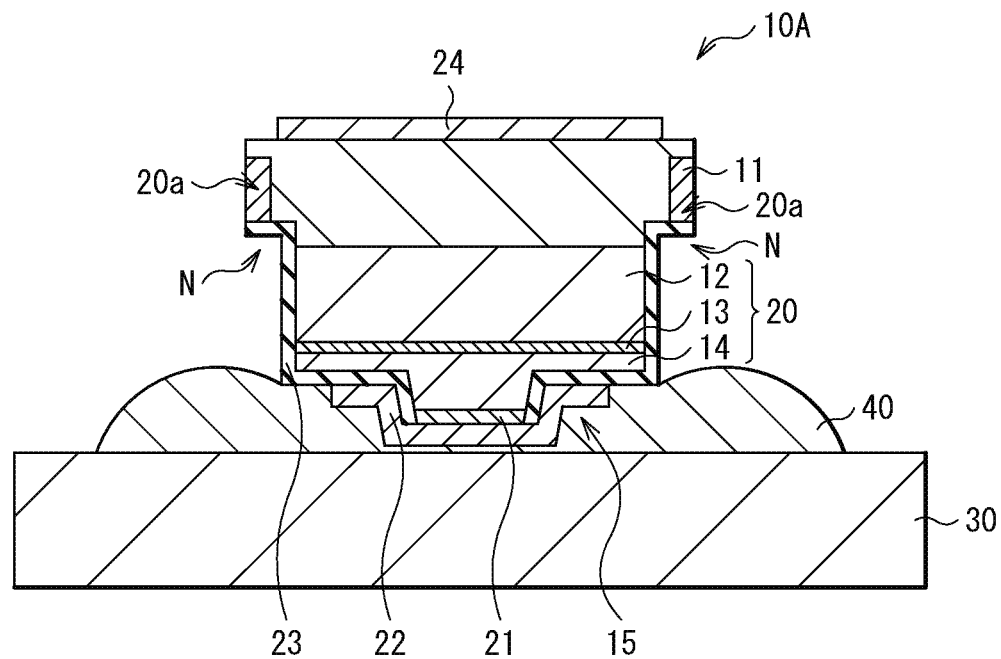

SEMICONDUCTOR LIGHT-EMITTING DEVICE AND METHOD OF MANUFACTURING SEMICONDUCTOR LIGHT-EMITTING DEVICE

CROSS REFERENCE TO RELATED APPLICATIONS

This application is a U.S. National Phase of International Patent Application No. PCT/JP2019/005605 filed on Feb. 15, 2019, which claims priority benefit of Japanese Patent Application No. JP 2018-050642 filed in the Japan Patent Office on Mar. 19, 2018. Each of the above-referenced applications is hereby incorporated herein by reference in its entirety.

TECHNICAL FIELD

The present technology relates to a semiconductor light-emitting device and a manufacturing method thereof. The semiconductor light-emitting device has a stacked structure of a first conductive-type semiconductor layer, an active layer, and a second conductive-type semiconductor layer, for example.

BACKGROUND ART

A semiconductor light-emitting device such as a semiconductor laser or the like includes a semiconductor layer in which a first conductive-type semiconductor layer, an active layer, and a second semiconductor layer are stacked in this order (See PTL 1 and PTL 2, for example). This semiconductor layer is mounted on a support member via, for example, a solder layer or the like.

CITATION LIST

Patent Literature

PTL 1: Japanese Unexamined Patent Application Publication No. 2005-311309
PTL 2: Japanese Unexamined Patent Application Publication No. H 10-41583

SUMMARY OF THE INVENTION

In such a semiconductor light-emitting device, it is desired to suppress occurrence of a non-conforming item.

Therefore, it is desirable to provide a semiconductor light-emitting device configured to suppress occurrence of a non-conforming item and a manufacturing method thereof.

A semiconductor light-emitting device (1) according to an embodiment of the present technology includes a stacked body, a cutout section, and a high-resistance region. The stacked body includes a first conductive-type semiconductor layer, an active layer, and a second conductive-type semiconductor layer in this order and has paired side faces opposed to each other. The cutout section is provided on at least one of the paired side faces of the stacked body and has a bottom face where the first conductive-type semiconductor layer is exposed. The high-resistance region is provided from the vicinity of the bottom face of the cutout section to the side face of the stacked body and has electric resistance higher than the electric resistance of the stacked body in a periphery of the high-resistance region.

In the semiconductor light-emitting device (1) according to the embodiment of the present technology, the cutout section is provided on the side face of the stacked body, and the high-resistance region is provided from the vicinity of the bottom face of the cutout section to the side face of the stacked body. This provides the high-resistance region on the side face of the first conductive-type semiconductor layer of the side faces of the stacked body.

A method of manufacturing (1) a semiconductor light-emitting device according to the embodiment of the present technology includes forming a stacked body including a first conductive-type semiconductor layer, an active layer, and a second conductive-type semiconductor layer in this order; forming, on at least one side face of the stacked body, a cutout section having a bottom face where the first conductive-type semiconductor layer is exposed; and forming a high-resistance region from the vicinity of the bottom face of the cutout section to the side face of the stacked body. The high-resistance region has electric resistance higher than the electric resistance of the stacked body in a periphery of the high-resistance region.

In the method of manufacturing (1) the semiconductor light-emitting device according to the embodiment of the present technology, the cutout section is formed on the side face of the stacked body, and the high-resistance region is formed from the vicinity of the bottom face of the cutout section to the side face of the stacked body. This forms the high-resistance region on the side face of the first conductive-type semiconductor layer of the side faces of the stacked body.

A semiconductor light-emitting device (2) according to an embodiment of the present technology incudes a substrate, a stacked body, a cutout section, and a high-resistance region. The stacked body is provided on the substrate, includes a first conductive-type semiconductor layer, an active layer, and a second conductive-type side face in this order, and has paired side faces opposed to each other. The cutout section is provided from at least one of the paired side faces of the stacked body to the substrate and has a bottom face where the substrate is exposed. The high-resistance region is provided in the vicinity of the bottom face of the cutout section and has electric resistance higher than the electric resistance of the substrate in a periphery of the high-resistance region.

In the semiconductor light-emitting device (2) according to the embodiment of the present technology, the cutout section is provided from the side face of the stacked body to the substrate, and the high-resistance region is provided in the vicinity of the bottom face of this cutout section. This provides the high-resistance region on the substrate.

A method of manufacturing (2) a semiconductor light-emitting device according to the embodiment of the present technology includes forming a stacked body that includes a first conductive-type semiconductor layer, an active layer, and a second conductive-type semiconductor layer in this order on a substrate; forming, from at least one side face of the stacked body to the substrate, a cutout section having a bottom face where the substrate is exposed; and forming, in the vicinity of the bottom face of the cutout section, a high-resistance region having electric resistance higher than the electric resistance of the substrate in a periphery.

In the method of manufacturing (2) the semiconductor light-emitting device according to the present technology, the cutout section is formed from the side face of the stacked body to the substrate, and the high-resistance region is formed in the vicinity of the bottom face of this cutout section. This forms the high-resistance region on the substrate.

With the semiconductor light-emitting device (1) and the semiconductor light-emitting device (2) according to the embodiments of the present technology, the high-resistance region is provided on the side face of the first conductive-type semiconductor layer or on the substrate. This makes it possible to suppress occurrence of shorting via a solder layer even if the solder layer provided on side of the second conductive-type semiconductor is in contact with the side face of the first conductive-type semiconductor layer. In addition, with the method of manufacturing (1) the semiconductor light-emitting device and the method of manufacturing (2) the semiconductor light-emitting device according to the embodiments of the present technology, the high-resistance region is formed on the side face of the first conductive-type semiconductor layer or on the substrate. This makes it possible to suppress the occurrence of the shorting via the solder layer even if the solder layer provided on the side of the second conductive-type semiconductor is in contact with the side face of the first conductive-type semiconductor layer. Therefore, it is possible to suppress the production of the non-conforming item.

It is to be noted that the foregoing content is merely an example of the present disclosure. The effects of the present disclosure are not limited to the foregoing, and may be other effects or further include other effects.

BRIEF DESCRIPTION OF DRAWINGS

FIG. 1 is a cross-sectional schematic diagram illustrating a schematic configuration of a semiconductor light-emitting device according to a first embodiment of the present technology.

FIG. 2 is a cross-sectional schematic diagram illustrating another example of a configuration of a high-resistance region illustrated in FIG. 1.

FIG. 3A is a cross-sectional schematic diagram illustrating a manufacturing process of the semiconductor light-emitting device illustrated in FIG. 1.

FIG. 3B is a cross-sectional schematic diagram illustrating a process following FIG. 3A.

FIG. 3C is a cross-sectional schematic diagram illustrating a process following FIG. 3B.

FIG. 3D is a cross-sectional schematic diagram illustrating a process following FIG. 3C.

FIG. 3E is a cross-sectional schematic diagram illustrating a process following FIG. 3D.

FIG. 3F is a cross-sectional schematic diagram illustrating a process following FIG. 3E.

FIG. 3G is a cross-sectional schematic diagram illustrating a process following FIG. 3F.

FIG. 3H is a cross-sectional schematic diagram illustrating a process following FIG. 3G.

FIG. 4A is a cross-sectional schematic diagram illustrating another example (1) of the manufacturing process of the semiconductor light-emitting device illustrated in FIG. 1.

FIG. 4B is a cross-sectional schematic diagram illustrating a process following FIG. 4A.

FIG. 5A is a cross-sectional schematic diagram illustrating other example (2) of the manufacturing process of the semiconductor light-emitting device illustrated in FIG. 1.

FIG. 5B is a cross-sectional schematic diagram illustrating a process following FIG. 5A.

FIG. 6 is a cross-sectional schematic diagram illustrating a configuration of a semiconductor light-emitting device according to a comparative example.

FIG. 7 is a cross-sectional schematic diagram illustrating a schematic configuration of a semiconductor light-emitting device according to a second embodiment of the present technology.

MODES FOR CARRYING OUT THE INVENTION

In the following, some embodiments of the present technology are described in detail with reference to the drawings. It is to be noted that description is given in the following order.

1. First Embodiment

A semiconductor light-emitting device having a first conductive-type semiconductor layer exposed on a bottom face of a cutout section 2. Second Embodiment A semiconductor light-emitting device having a substrate exposed on a bottom face of a cutout section

First Embodiment

[Configuration of Semiconductor Light-Emitting Device 10]

FIG. 1 illustrates a schematic cross-sectional configuration of a semiconductor light-emitting device (semiconductor light-emitting device 10) according to a first embodiment of the present technology. This semiconductor light-emitting device 10 is, for example, a semiconductor laser that outputs light having a wavelength in a visible region, and includes a substrate 11, a stacked body 20, a support member 30, and a solder layer 40. This semiconductor light-emitting device 10 is mounted by means of a so-called junction down method. On the support member 30 are provided the solder layer 40, the stacked body 20, and the substrate 11 in this order.

The substrate 11 is, for example, a gallium nitride (GaN) substrate and has a thickness of 300 μm to 500 μm, for example. The substrate 11 may include, for example, gallium arsenic (GaAs), indium phosphorus (InP) gallium indium nitride (InGaN), sapphire, silicon (Si), or silicon carbide (SiC), etc.

The stacked body 20 has a stacked structure in which, for example, an n-type clad layer 12 (first conductive-type semiconductor layer), an active layer 13, and a p-type clad layer 14 (second conductive-type semiconductor layer) are stacked in this order from side of the substrate 11. The stacked body 20 includes, for example, a group III-V nitride semiconductor layer. The group III-V nitride semiconductor layer is a gallium nitride-based compound including Ga (gallium) and N (nitrogen), for example. Specifically, examples of the gallium nitride-based compound include GaN, AlGaN (aluminum gallium nitride), and AlGaInN (aluminum nitride gallium indium), etc. Alternatively, the stacked body 20 may include a semiconductor material based on AlGaAs (aluminum gallium arsenide), aluminum indium gallium arsenide (AlInGaAs), or aluminum gallium indium phosphide (AlGaInP), etc. It is to be noted that in the following, a stacking direction (Z-axis direction in FIG. 1) of the stacked body 20 is referred to as a vertical direction, an output direction of laser light (Y direction in FIG. 1) is referred to as an axial direction, and a direction (X direction in FIG. 1) perpendicular to the axial direction and the vertical direction is referred to as a horizontal direction. The stacked body 20 has a size of, for example, 1 μm to 10 μm in the vertical direction.

The n-type clad layer 12 provided on the substrate 11 includes n-type AlGaN, for example. The n-type clad layer 12 includes, for example, a group IV element, a group VI element, or the like as an n-type impurity. Specifically, examples of the n-type impurity include Si (silicon), Ge (germanium), O (oxygen), or Se (selenium), etc.

The active layer 13 provided between the n-type clad layer 12 and the p-type clad layer 14 has an undoped GaInN multiple quantum well structure, for example. For example, an n-type guide layer including n-type GaN may be provided between the active layer 13 and the n-type clad layer 12. For example, a p-type guide layer including p-type GaN may be provided between the active layer 13 and the p-type clad layer 14.

The p-type clad layer 14 opposed to the n-type clad layer 12 with the active layer 13 in-between includes p-type AlGaN, for example. The p-type clad layer 14 includes a group II element or the group IV element, or the like, as a p-type impurity. Specifically, examples of the p-type impurity include Mg (magnesium), Zn (zinc), or C (carbon), etc. The p-type clad layer 14 is opposed to the substrate 11 with the active layer 13 and the n-type clad layer 12 in-between.

A portion of the p-type clad layer 14 constitutes a ridge portion (protrusion) 15 extending in the axial direction. Of the active layer 13, a region corresponding to the ridge portion 15 is a current injection region (light-emitting region). This ridge portion 15 has a function to limit a size of the current injection region of the active layer 13, and to control an optical mode in the horizontal direction to a basic (zero order) mode in a stable manner to guide a wave to the axial direction. A p-type contact layer may be provided between the p-type clad layer 14 and a p-side contact electrode layer 21 to be described later. The p-type contact layer includes p-type GaN, for example. At this time, the ridge portion 15 includes the portion of the p-type clad layer 14 and the p-type contact layer.

A pair of side faces $S_{20}$ (YZ plane in FIG. 1) is provided in the stacked body 20. The pair of the side faces $S_{20}$ is spaced from the ridge portion 15 and provided parallel to an extending direction of the ridge portion 15 (the axial direction). The side faces $S_{20}$ in the pair are opposed to each other. In the present embodiment, a cutout section N is provided on both of the side faces $S_{20}$ in this pair. This cutout section N is a portion where a portion from the p-type clad layer 14 to the n-type clad layer 12 is cut out in the vertical direction. In the portion where the cutout section N is provided, a width of the stacked body 20 in the horizontal direction is small. The n-type clad layer 12 is exposed on a bottom face of this cutout section N. The cutout section N has a size of 0.5 μm to 10 μm, for example, in the vertical direction.

Here, a high-resistance region 20a is provided from the n-type clad layer 12 in the vicinity of the bottom face of this cutout section N to each of the side faces $S_{20}$ of the stacked body 20. The high-resistance region 20a is provided across the n-type clad layer 12 to a portion of the substrate 11. That is, the high-resistance region 20a is provided on the n-type clad layer 12 in the vicinity of the bottom face of the cutout section N and the side face of the substrate 11. This high-resistance region 20a is a region having higher electric resistance than the electric resistance of the stacked body 20 in the periphery. The high-resistance region 20a has an electric resistance of approximately $10^2$ Ωcm or higher, for example. Although details are described later, provision of the high-resistance region 20a on the side faces of the n-type clad layer 12 makes it possible to suppress the occurrence of the shorting between the n-type clad layer 12 and the p-type clad layer 14 via the solder layer 40.

The high-resistance region 20a is formed by ion injection using, for example, elements such as Al (aluminum), B (boron), or C (carbon), which is described later. Such elements are included in the high-resistance region 20a. The ion injection destroys crystals in some region (high-resistance region 20a) of the stacked body 20 or inactivates carriers in some region of the stacked body 20 and makes the region highly resistive. The high-resistance region 20a has the size of, for example, 0.5 μm or greater in the vertical direction. The size of the high-resistance region 20a in the horizontal direction is smaller than the size of the cutout section N in the horizontal direction, for example. The size of the high-resistance region 20a in the horizontal direction may be larger than or the same as the size of the cutout section N in the horizontal direction.

FIG. 2 illustrates a configuration of the stacked body 20 in which the high-resistance region 20a is provided across a wider region. As such, the high-resistance region 20a may be provided across the side face of the active layer 13 and the side face of the p-type clad layer 14 from the vicinity of the bottom face of the cutout section N.

The semiconductor light-emitting device 10 has the p-side contact electrode layer 21 and a p-side pad electrode layer 22 between the ridge portion 15 of the stacked body 20 and the solder layer 40. An insulating film 23 covers from the side face of the ridge portion 15 to the cutout section N of the stacked body 20. A pair of unillustrated reflecting mirror films is provided on an end face (resonator end face). The end face is parallel to a face (XZ plane) perpendicular to the extending direction of the ridge portion 15 (axial direction). These reflecting mirror films in the pair each have mutually different reflectance. With this, light generated in the active layer 13 is amplified by reciprocating between the pair of reflecting mirror films and outputted from one of the reflecting mirror films as a laser beam.

The p-side contact electrode layer 21 is provided in contact with the p-type clad layer 14 of the stacked body 20. It is preferable that the p-side contact electrode layer 21 include a material which forms a good contact (ohmic contact) with the p-type clad layer 14. The p-side contact electrode layer 21 includes, for example, Ni (nickel), Pd (palladium), Pt (platinum), or ITO (Indium Thin Oxide), etc. The p-side contact electrode layer 21 may have a single-layer structure or a multi-layer structure.

The p-side pad electrode layer 22 is opposed to the p-type clad layer 14 with the p-side contact electrode layer 21 in-between and is provided to cover at least whole of the p-side contact electrode layer 21. That is, the p-side pad electrode layer 22 is in contact with a whole top face of the p-side contact electrode layer 21. It is to be noted that the p-side contact electrode 21 may not be in direct contact with the p-side pad electrode layer 22 as long as the p-side contact electrode layer 21 is electrically coupled with the p-side pad electrode layer 22. That is, another electrically-conducting material may be provided between the p-side contact electrode layer 21 and the p-side pad electrode layer 22. The p-side pad electrode layer 22 may have the single-layer structure or the multi-layer structure. In a case where the p-side pad electrode layer 22 has the multi-layer structure, the multi-layer structure may be a stacked structure including, for example, a Ti (titanium) layer, a Pt layer, and an Au (gold) layer.

The insulating film 23 is provided between the p-side pad electrode layer 22 and the side face of the ridge portion 15.

This insulating film 23 is provided from the side face of the ridge portion 15 to the side face and the bottom face of the cutout section N. A portion of the n-type clad layer 12 (n-type clad layer 12 below the cutout section N) and the side face of the substrate 11 are exposed from the insulating film 23, for example. To efficiently trap light into the ridge portion 15, the insulating film 23 preferably includes an insulating material having a lower refractive index than the refractive index of the semiconductor material that constitutes the stacked body 20. Examples of constituent materials of such an insulating film 23 include $SiO_2$ (silicon dioxide), etc. Alternatively, the insulating film 23 may include SiN (silicon nitride), etc.

An n-side electrode layer 24 is provided on a rear face of the substrate 11. The rear face is a face opposite to a face where the stacked body 20 is provided. The n-side electrode layer 24 has a structure in which the Ti layer, the Pt layer, and the Au layer, for example, are stacked in sequence from side of the substrate 11. Alternatively, the n-side electrode layer 24 may have the single-layer structure.

The support member 30 provided opposite to the ridge portion 15 of the stacked body 20 is a so-called sub-mount. This support member 30 is provided opposite to the substrate 11 with the stacked body 20 in-between. More specifically, the support member 30 is opposed to the n-type clad layer 12 with the active layer 13 and the p-type clad layer 14 in-between. The support member 30 includes, for example, AlN (aluminum nitride), SiC (silicon carbide), or Si (silicon), etc. Of these, the support member 30 preferably includes AlN or SiC. One reason for this is that the support member 30 preferably includes a material having high heat conductivity, in terms of heat dissipation.

The solder layer 40 is provided between the support member 30 and the p-side pad electrode layer 22 and is to join the stacked body 20 to the support member 30. This solder layer 40 is provided over a wider region than the stacked body 20 and the substrate 11 and greater in width than the stacked body 20 in the horizontal direction. The solder layer 40 includes, for example, a tin-based solder such as AuSn (gold-tin) or AgSn (silver-tin), etc.

[Method of Manufacturing Semiconductor Light-Emitting Device 10]

It is possible to manufacture the semiconductor light-emitting device 10 having such a configuration in the following manner, for example.

FIGS. 3A, 3B, 3C, 3D, 3E, 3F, 3G, and 3H are cross-sectional schematic diagrams illustrating the manufacturing method in the order of processes. First, to form the semiconductor light-emitting device 10, the stacked body 20 is formed on the substrate 11 by means of a metalorganic chemical vapor deposition method, for example. The stacked body 20 is formed on the substrate 11 by stacking the n-type clad layer 12, the active layer 13, and the p-type clad layer 14 in this order. At this time, for example, trimethyl aluminum (TMA), trimethyl gallium (TMG), trimethyl indium (TMIn), or ammonia (NH3) is used as a raw material of a GaN-based compound semiconductor. For example, silane (SiH4) is used as a raw material of a donor impurity. For example, bis-cyclopentadienyl magnesium (Cp2Mg) is used as a raw material of an acceptor impurity.

After the stacked body 20 is formed, grooves are formed in a stripe form, as illustrated in FIG. 3A. Each groove penetrates the p-type clad layer 14 and the active layer 13, reaching a portion of the n-type clad layer 12. That is, the n-type clad layer 12 is exposed from the bottom face of the groove. The groove has a size of 0.5 μm to 10 μm in the vertical direction, for example. The groove has a size of 5 μm or larger in the horizontal direction, for example. This groove forms the cutout section N in each chip.

After the cutout section N is formed, ion injection is performed on the bottom face of the cutout section N, as illustrated in FIG. 3B. This forms the high-resistance region 20a in the vicinity of the bottom face of the cutout section N. For example, elements such as Al, B, or C, etc. are used for the ion injection. It is preferable that the ion injection be performed all across the bottom face of the cutout section N. This makes it possible to suppress variations in the size of the high-resistance region 20a in each chip. Formation of the high-resistance region 20a may also be performed through the use of a method other than the ion injection, such as heat diffusion or the like, for example. Expanding a size in the horizontal direction of a region where the ion injection is performed also makes it possible to form the high-resistance region 20a on the side face of the active layer and the side face of the p-type clad layer 14 (See FIG. 2).

After the high-resistance region 20a is formed, the p-side contact electrode layer 21 extending like a belt is formed on the p-type clad layer 14, as illustrated in FIG. 3C. Thereafter, the ridge portion 15 is formed on an upper part of the stacked body 20 (FIG. 3D). The ridge portion 15 is formed in the following manner, for example. First, an unillustrated mask layer is selectively formed on the p-side contact electrode layer 21, for example. After that, a portion of the p-type clad layer 14 being in the exposed region and not covered by that mask layer is removed by means of a reactive ion etching (Reactive Ion Etching: RIE) method. Thereafter, the mask layer is removed. This forms the belt-like ridge portion 15.

Subsequently, as illustrated in FIG. 3E, the insulating film 23 is formed. The insulating film 23 is formed to cover the top face of the ridge portion 15 to the side face and the bottom face of the cutout section N. For example, the side face of the n-type clad layer 12 and the side face of the substrate 11 below the cutout section N are exposed from the insulating film 23. Then, as illustrated in FIG. 3F, lithography processing and etching are performed on this insulating film 23 to form an opening on the insulating film 23. The p-side contact electrode layer 21 is exposed from the opening of this insulating film 23.

Next, as illustrated in FIG. 3G, the p-side pad electrode layer 22, which is in contact with the p-side contact electrode 21, is formed. The p-side pad electrode layer 22 is formed to cover the top face and the side face of the ridge portion 15. Next, after a thickness of the substrate 11 is adjusted by wrapping side of the rear face of the substrate 11, the n-side electrode layer 24 is formed by the lithography processing, the etching, and lift-off processing being performed. After this, as illustrated in FIG. 3H, chip individualization is performed in accordance with a position of each cutout section N.

After this, the stacked body 20 is joined to the support member 30 via the solder layer 40. The semiconductor light-emitting device 10 is finished through such processes.

FIGS. 4A and 4B illustrate another example (1) of the method of manufacturing the semiconductor light-emitting device 10 described above.

First, the stacked body 20 and the p-side contact electrode layer 21 are formed in this order on a base 511 (FIG. 4A). Then, the ridge portion 15 is formed on the upper part of the stacked body 20 (FIG. 4B). The formation of the cutout section N and the ion injection (See FIGS. 3A and 3B) may be performed after the ridge portion 15 is formed.

FIGS. 5A and 5B illustrate other example (2) of the method of manufacturing the semiconductor light-emitting device 10 described above.

First, after the stacked body 20 is formed on the substrate 11, the cutout section N is formed (See FIG. 3A). Then, the p-side contact electrode layer 21, the ridge portion 15, and the insulating film 23 are formed (FIG. 5A). After this, as illustrated in FIG. 5B, the ion injection may be performed via the insulating film 23, thus forming the high-resistance region 20a.

[Workings and Effects of Semiconductor Light-Emitting Device 10]

In this semiconductor light-emitting device 10, when a predetermined voltage is applied between the p-side contact electrode layer 21 of the ridge portion 15 and the n-side electrode layer 24, a current blocked by the ridge portion 15 is injected into the current injection region (light-emitting region). This results in emission of light due to re-combination of an electron and a hole. This light is reflected by the pair of reflecting mirror films. The light causes laser oscillation at a wavelength a phase change of which is an integral multiple of $2\pi$ when the light makes a round trip. The light is externally outputted as a beam.

In the present embodiment, the high-resistance region 20a is provided on the side face $S_{20}$ of the stacked body 20, specifically, the side face of the n-type clad layer 12. Therefore, even if the solder layer 40 is in contact with the side face of the n-type clad layer 12, it is possible to suppress the occurrence of the shorting between the n-type clad layer 12 and the p-type clad layer 14 via the solder layer 40. In the following, description is given of the workings and effects by means of a comparative example.

FIG. 6 illustrates a schematic cross-sectional configuration of a semiconductor light-emitting device (semiconductor light-emitting device 100) according to the comparative example. This semiconductor light-emitting device 100 has no high-resistance region (high-resistance region 20a of FIG. 1) on the side face $S_{20}$ of the stacked body 20. In addition, no cutout section (cutout section N of FIG. 1) is provided on the side face $S_{20}$ of the stacked body 20. In the semiconductor light-emitting device 100, the stacked body 20 is joined to the support member 30 by means of the junction down method.

In such a semiconductor light-emitting device 100, it is likely that the solder layer 40 between the stacked body 20 and the support member 30 is eutectically formed in a state swelling from the side of the ridge portion 15 (p-type clad layer 14) to a periphery of the stacked body 20. When this swelled solder layer 40 is in contact with the side face of the n-type clad layer 12, shorting (shorting C) occurs between the n-type clad layer 12 and the p-type clad layer 14. This shorting C results in a non-conforming item.

Moreover, formation of the high-resistance region without providing the cutout section on the side face $S_{20}$ of the stacked body 20 might not allow for formation of the high-resistance region at a sufficient depth. That is, there is a possibility that the high-resistance region is not formed on the side face of the n-type clad layer 12.

In contrast to this, in the semiconductor light-emitting device 10, the cutout section N is provided on the side face $S_{20}$ of the stacked body 20, and the high-resistance region 20a is provided from the vicinity of the bottom face of this cutout section N to the side face $S_{20}$ of the stacked body 20. This ensures provision of the high-resistance region 20a on the side face of the n-type clad layer 12 of the side face $S_{20}$ of the stacked body 20. Therefore, even if the solder layer 40 is in contact with the n-type clad layer 12, it is possible to suppress the occurrence of the shorting via the solder layer 40. Hence, it is possible to suppress the production of the non-conforming item.

As described above, in the present embodiment, the high-resistance region 20a is provided on the side face of the n-type clad layer 12 of the side face $S_{20}$ of the stacked body 20. Therefore, even if the solder layer 40 provided on side of the p-type clad layer 14 is in contact with the side face of the n-type clad layer 12, it is possible to suppress the occurrence of the shorting via the solder layer 40. Hence, it is possible to suppress the production of the non-conforming item.

In addition, the high-resistance region 20a may also be provided on the side face of the active layer 13 and the side face of the p-type clad layer 14 together with the side face of the n-type clad layer 12 (FIG. 2). This allows for more reliable suppression of the occurrence of the shorting via the solder layer 40.

Although another embodiment is hereinafter described, the same components as the components of the foregoing embodiment are denoted by the same reference numerals in the following description, and description thereof is omitted where appropriate.

Second Embodiment

FIG. 7 schematically illustrates a cross-sectional configuration of a semiconductor light-emitting device (semiconductor light emitting device 10A) according to a second embodiment of the present technology. The substrate 11 is exposed on the bottom face of the cutout section N of this semiconductor light-emitting device 10A. Except for this point, the semiconductor light-emitting device 10A has a similar configuration to the semiconductor light-emitting device 10 of the foregoing first embodiment, and the workings and effects thereof are also similar.

In the semiconductor light-emitting device 10A, the cutout section N is provided from the side face $S_{20}$ of the stacked body 20 to the substrate 11. The substrate 11 is exposed on the bottom face of the cutout section N. The high-resistance region 20a is provided in the vicinity of the bottom face of this cutout section N, that is, the side face of the substrate 11.

The insulating film 23 covers the side face of the ridge portion 15 to the side face and the bottom face of the cutout section N. This insulating film 23 covers the side face of the n-type clad layer 12.

The cutout section N may be formed deeper in this manner, and the substrate 11 may be exposed on the bottom face of the cutout section N. In this case, it is also possible to obtain the effects equivalent to the effects of the foregoing first embodiment. It is possible to manufacture the semiconductor light-emitting device 10A with a method similar to the method described in the foregoing first embodiment.

Although description has been given of the present technology as above, the present technology is not limited to the foregoing embodiments, and it is possible to make different variations thereto. For example, the components, the disposition, and the number of the semiconductor light-emitting devices 10 and 10A which are exemplified in the foregoing embodiments are merely examples, and the semiconductor light-emitting devices 10 and 10A may further have other components, for example.

In addition, in the semiconductor light-emitting devices 10 and 10A, although description is given of the case where the cutout section N is provided on either of the side faces $S_{20}$ in the pair of the stacked body 20, it is sufficient that the cutout section N is provided on at least one of the side faces $S_{20}$ in the pair.

In addition, in the foregoing embodiments, although description is given of the method of manufacturing the semiconductor light-emitting device 10, order of formation and a method of formation of the respective components or the like are not limited thereto. For example, the cutout section N may be formed after the ion injection is performed.

Moreover, in the foregoing embodiments, although description is given of the case where the semiconductor light-emitting devices 10 and 10A are each the semiconductor laser, it is also possible to apply the present technology to a semiconductor light-emitting device such as a LED (Light Emitting Diode), or the like, for example.

In addition, in the foregoing embodiments, although description is given of the case where the first conductive-type and the second conductive-type of the present technology are the n-type and the p-type, respectively, the first conductive-type may be the p-type and the second conductive-type may be the n-type.

It is to be noted that the effects described herein are merely illustrative, and are not limited thereto. There may be any effects other than the effects described herein.

Moreover, the present technology may have the following configurations, for example.

(1)
A semiconductor light-emitting device including:
a stacked body that includes a first conductive-type semiconductor layer, an active layer, and a second conductive-type semiconductor layer in this order and has paired side faces opposed to each other;
a cutout section that is provided on at least one of the paired side faces of the stacked body and has a bottom face where the first conductive-type semiconductor layer is exposed; and
a high-resistance region that is provided from vicinity of the bottom face of the cutout section to the side face of the stacked body and has electric resistance higher than electric resistance of the stacked body in a periphery of the high-resistance region.

(2)
The semiconductor light-emitting device according to (1), in which the cutout section is provided on both of the paired side faces.

(3)
The semiconductor light-emitting device according to (1) or (2), further including a substrate opposed to the second conductive-type semiconductor layer with the first conductive-type semiconductor layer and the active layer in-between.

(4)
The semiconductor light-emitting device according to any one of (1) to (3), further including:
a support member that is opposed to the first conductive-type semiconductor layer with the active layer and the second conductive-type semiconductor layer in-between; and
a solder layer that is provided between the support member and the stacked body.

(5)
The semiconductor light-emitting device according to (4), in which the solder layer is provided between the support member and the stacked body and greater in width than the stacked body.

(6)
The semiconductor light-emitting device according to any one of (1) to (5), further including an insulting film that covers the cutout section.

(7)
The semiconductor light-emitting device according to any one of (1) to (6), in which the semiconductor light-emitting device functions as a semiconductor laser.

(8)
The semiconductor light-emitting device according to any one of (1) to (7), in which
a ridge portion is provided on the second conductive-type semiconductor layer, the ridge portion extending in a direction, and
the paired side faces are provided parallel to the direction in which the ridge portion extends.

(9)
The semiconductor light-emitting device according to any one of (1) to (8), including aluminum (Al), boron (B), or carbon (C) in the high-resistance region.

(10)
The semiconductor light-emitting device according to any one of (1) to (9), in which the high-resistance region is provided in the first conductive-type semiconductor layer.

(11)
The semiconductor light-emitting device according to any one of (1) to (10), in which the high-resistance region is provided in the first conductive-type semiconductor layer, the active layer, and the second conductive-type semiconductor layer.

(12)
A semiconductor light-emitting device including:
a substrate;
a stacked body that is provided on the substrate, includes a first conductive-type semiconductor layer, an active layer, and a second conductive-type semiconductor layer in this order, and has paired side faces opposed to each other;
a cutout section that is provided from at least one of the paired side faces of the stacked body to the substrate and has a bottom face where the first conductive-type semiconductor layer is exposed; and
a high-resistance region that is provided in vicinity of the bottom face of the cutout section and has electric resistance higher than electric resistance of the stacked body in a periphery of the high-resistance region.

(13)
A method of manufacturing a semiconductor light-emitting device including:
forming a stacked body that includes a first conductive-type semiconductor layer, an active layer, and a second conductive-type semiconductor layer in this order;
forming a cutout section that has, on at least one side face of the stacked body, a bottom face where the first conductive-type semiconductor layer is exposed; and
forming a high-resistance region from vicinity of the bottom face of the cutout section to the side face of the stacked body, the high resistance region having electric resistance higher than the electric resistance of the stacked body in a periphery of the high resistance region.

(14)
The method of manufacturing the semiconductor light-emitting device according to (13), wherein the high-resistance region is formed by performing ion injection on the bottom face of the cutout section.

(15)
The method of manufacturing the semiconductor light-emitting device according to (13) or (14), further including:

disposing a support member opposed to the first conductive-type semiconductor layer with the active layer and the second conductive-type semiconductor layer in-between; and joining the support member and the stacked body by means of a solder layer.

(16) A method of manufacturing a semiconductor light-emitting device including:

forming a stacked body that includes a first conductive-type semiconductor layer, an active layer, and a second conductive-type semiconductor layer in this order on a substrate;

forming a cutout section from at least one side face of the stacked body to the substrate, the cutout section having a bottom face where the substrate is exposed; and forming a high-resistance region in vicinity of the bottom face of the cutout section, the high-resistance region having electric resistance higher than the electric resistance of the substrate in a periphery of the high-resistance region.

This application claims the benefits of Japanese Priority Patent Application JP 2018-50642 filed with the Japan Patent Office on Mar. 19, 2018, the entire contents of which are incorporated herein by reference.

It should be understood that those skilled in the art could conceive various modifications, combinations, sub-combinations, and alterations depending on design requirements and other factors, insofar as they are within the scope of the appended claims or the equivalents thereof.

The invention claimed is:

1. A semiconductor light-emitting device, comprising:
a stacked body that includes a first conductive-type semiconductor layer, an active layer, and a second conductive-type semiconductor layer in this order, wherein the stacked body has paired side faces opposed to each other;
a cutout section that is on at least one of the paired side faces of the stacked body, wherein the cutout section has a bottom face where the first conductive-type semiconductor layer is exposed; and
a high-resistance region that is in vicinity of the bottom face of the cutout section and the side face of the stacked body, wherein the high-resistance region has electric resistance higher than electric resistance of the stacked body in a periphery of the high-resistance region.

2. The semiconductor light-emitting device according to claim 1, wherein the cutout section is on both of the paired side faces.

3. The semiconductor light-emitting device according to claim 1, further comprising a substrate opposed to the second conductive-type semiconductor layer with the first conductive-type semiconductor layer and the active layer in-between.

4. The semiconductor light-emitting device according to claim 1, further comprising:
a support member that is opposed to the first conductive-type semiconductor layer with the active layer and the second conductive-type semiconductor layer in-between; and
a solder layer that is between the support member and the stacked body.

5. The semiconductor light-emitting device according to claim 4, wherein the solder layer is between the support member and the stacked body and greater in width than the stacked body.

6. The semiconductor light-emitting device according to claim 1, further comprising an insulting film that covers the cutout section.

7. The semiconductor light-emitting device according to claim 1, wherein the semiconductor light-emitting device functions as a semiconductor laser.

8. The semiconductor light-emitting device according to claim 1, wherein
a ridge portion is on the second conductive-type semiconductor layer, the ridge portion extending in a direction, and
the paired side faces are parallel to the direction in which the ridge portion extends.

9. The semiconductor light-emitting device according to claim 1, comprising aluminum (Al), boron (B), or carbon (C) in the high-resistance region.

10. The semiconductor light-emitting device according to claim 1, wherein the high-resistance region is in the first conductive-type semiconductor layer.

11. The semiconductor light-emitting device according to claim 1, wherein the high-resistance region is in the first conductive-type semiconductor layer, the active layer, and the second conductive-type semiconductor layer.

12. A semiconductor light-emitting device, comprising:
a substrate;
a stacked body that is on the substrate, includes a first conductive-type semiconductor layer, an active layer, and a second conductive-type semiconductor layer in this order, wherein the stacked body has paired side faces opposed to each other;
a cutout section that is on at least one of the paired side faces of the stacked body and a side face of the substrate, wherein the cutout section has a bottom face where the substrate is exposed; and
a high-resistance region that is in vicinity of the bottom face of the cutout section, wherein the high-resistance region has electric resistance higher than electric resistance of the stacked body in a periphery of the high-resistance region.

13. A method of manufacturing a semiconductor light-emitting device, comprising:
forming a stacked body that includes a first conductive-type semiconductor layer, an active layer, and a second conductive-type semiconductor layer in this order;
forming a cutout section that has, on at least one side face of the stacked body, a bottom face where the first conductive-type semiconductor layer is exposed; and
forming a high-resistance region in vicinity of the bottom face of the cutout section and the side face of the stacked body, wherein the high-resistance region has electric resistance higher than electric resistance of the stacked body in a periphery of the high-resistance region.

14. The method of manufacturing the semiconductor light-emitting device according to claim 13, wherein the high-resistance region is formed by performing ion injection on the bottom face of the cutout section.

15. The method of manufacturing the semiconductor light-emitting device according to claim 13, further comprising:
disposing a support member opposed to the first conductive-type semiconductor layer with the active layer and the second conductive-type semiconductor layer in-between; and
joining the support member and the stacked body by means of a solder layer.

16. A method of manufacturing a semiconductor light-emitting device, comprising:
- forming a stacked body that includes a first conductive-type semiconductor layer, an active layer, and a second conductive-type semiconductor layer in this order on a substrate;
- forming a cutout section on at least one side face of the stacked body and a side face of the substrate, wherein the cutout section has a bottom face where the substrate is exposed; and
- forming a high-resistance region in vicinity of the bottom face of the cutout section, wherein the high-resistance region has electric resistance higher than the electric resistance of the substrate in a periphery of the high-resistance region.

* * * * *